(12) United States Patent
Takayoshi et al.

(10) Patent No.: US 7,035,030 B2
(45) Date of Patent: Apr. 25, 2006

(54) AMPLIFIER APPARATUS AND MAGNETIC RECORDING AND REPRODUCING APPARATUS HAVING THE SAME

(75) Inventors: Kazue Takayoshi, Kagoshima (JP); Michiya Sako, Kagoshima (JP)

(73) Assignee: Sony Corporation, (JP)

( * ) Notice: Subject to any disclaimer, the term of this patent is extended or adjusted under 35 U.S.C. 154(b) by 242 days.

(21) Appl. No.: 10/717,544

(22) Filed: Nov. 21, 2003

(65) Prior Publication Data

US 2004/0125480 A1 Jul. 1, 2004

(30) Foreign Application Priority Data

Dec. 27, 2002 (JP) .......................... P2002-382377

(51) Int. Cl.
*G11B 5/02* (2006.01)

(52) U.S. Cl. ...................................... 360/67
(58) Field of Classification Search ................. 360/67, 360/31, 29, 25, 46; 324/210
See application file for complete search history.

(56) References Cited

U.S. PATENT DOCUMENTS

| | | | | |
|---|---|---|---|---|
| 6,101,054 A * | 8/2000 | Tsunoda | ........................ | 360/46 |
| 6,219,195 B1 * | 4/2001 | Jusuf et al. | ................... | 360/67 |
| 6,256,157 B1 * | 7/2001 | Biskeborn et al. | ............ | 360/31 |
| 6,304,397 B1 * | 10/2001 | Ozue et al. | .................... | 360/29 |
| 6,359,743 B1 * | 3/2002 | Patti et al. | ..................... | 360/25 |
| 6,473,251 B1 * | 10/2002 | Patti et al. | ..................... | 360/25 |
| 6,479,988 B1 * | 11/2002 | Hachisuka et al. | ......... | 324/210 |
| 6,525,891 B1 * | 2/2003 | Tsunoda | ..................... | 360/25 |
| 6,633,446 B1 * | 10/2003 | Sako | ........................... | 360/67 |
| 6,754,015 B1 * | 6/2004 | Erden et al. | .................. | 360/25 |
| 6,943,545 B1 * | 9/2005 | Patland et al. | .............. | 324/210 |

* cited by examiner

*Primary Examiner*—David Hudspeth
*Assistant Examiner*—Fred F. Tzeng
(74) *Attorney, Agent, or Firm*—Rader, Fishman, & Grauer PLLC; Ronald P. Kananen

(57) ABSTRACT

The present invention provides a magnetic recording and reproducing apparatus having an amplifier apparatus, which is switched from a recording state to a readout state based on a control signal, reads out a signal containing a servo signal by the signal readout means, and includes the amplifier apparatus for amplifying the signal with an amplifier and outputting the amplified signal. In addition, the amplifier apparatus filters the signals by the filtering means that allows the high frequency portion of signals to pass through with a first cutoff frequency during a first prescribed time period after the readout state has been initiated; a second cutoff frequency that is lower than the first cutoff frequency during a second prescribed time period after the first prescribed time period has passed; and a third cutoff frequency that is lower than the second cutoff frequency after the second prescribed time period has passed.

6 Claims, 4 Drawing Sheets

PRIOR ART

AMPLIFIER APPARATUS AND MAGNETIC RECORDING AND REPRODUCING APPARATUS HAVING THE SAME

CROSS REFERENCE TO RELATED APPLICATIONS

The present document is based on Japanese Priority Document JP2002-382377, filed in the Japanese Patent Office on Dec. 27, 2002, the entire contents of which being incorporated herein by reference.

BACKGROUND OF THE INVENTION

1. Field of Invention

The present invention relates to an amplifier apparatus, that is connected to a magneto resistive (MR) head used for reproducing data stored in a magnetic recording and reproducing apparatus, such as a hard disk drive (HDD) or a floppy disk (FDD) drive, and amplifies and outputs signals, that have been read out using the MR head, and also refers to the magnetic recording and reproducing apparatus that includes the amplifier apparatus.

2. Description of Related Art

Conventionally, in a magnetic recording and reproducing apparatus, such as a hard disk drive or a floppy disk drive, in which signals, corresponding to data to be stored, are recorded by magnetizing a magnetic layer in a rotating recording medium and are reproduced by detecting the magnetic state of the magnetic layer, an MR head as a means of reading out signals that have been recorded in order to read out the magnetic state of the magnetic layer.

The MR head is positioned to face the disk-shaped recording medium, a resistance in the MR head changes with changes in the magnetic field in the magnetic layer of the recording medium, and signals are readout by detecting changes in the resistance of the MR head in a form of voltage signals.

Because the changes in the resistance of the MR head are very minute, voltage changes arising from the resistance changes are also minute. Normally, the voltage signals are amplified using an amplifier apparatus consisting of an amplifier circuit, such as shown in FIG. 4, in order to output amplified signals.

In the amplifier circuit, a bias voltage is applied on an MR head Rmr by connecting a first current source I1 and a second current source I2 to a first MR head connection terminal X1 and a second MR head connection terminal X2, respectively, which are connected to both ends of the MR head Rmr, respectively. Changes in the bias voltage, which correspond to the data being read out from the recording medium, are outputted as voltage signals on a first output line L1 and a second output line L2, which are connected to the first MR head connection terminal X1 and the second MR head connection terminal X2, respectively. The first output line L1 and the second output, line L2 are connected to an amplifier A, and the amplifier A generates and outputs amplified signals based on the voltage signals.

More specifically, a first high pass filter H1 for DC cutoff is placed in the middle of the first output line L1, and a second high pass filter H2 for DC cutoff is placed in the middle of the second output line L2. Cutoff frequencies of the high pass filters H1, H2 are 200 kHz to 1 MHz.

Furthermore, in the amplifier circuit, a third high pass filter H3 which is constituted by using a first transistor Q1 instead of a first resistor R1 of the first high pass filter H1, and a fourth high pass filter H4 which is constituted by using a second transistor Q2 instead of the second resistor R2 of the second high pass filter H2, are placed. A first switch SW1 is used for switching operations between a combination of the third high pass filter H3 and the fourth high pass filter H4 and a combination of the first high pass filter H1 and the second high pass filter H2.

The third high pass filter H3 and the fourth high pass filter H4 are used for dissipating in a short period time fluctuations of the voltage signals, which are caused by fluctuations in the bias voltage from a prescribed value in the MR head Rmr, when signals are recorded in the recording medium in the magnetic recording and reproducing apparatus.

Until the voltage signals become stable, the amplifier circuit does not output the amplified signals. After a period of time, that is required for stabilizing the voltage signals, passes, a second switch SW2 on an output side of the amplifier A is turned on for outputting the amplified signals. This time period, during which the second switch SW2 delays starting the output of the amplified signals, is called a delay time.

SUMMARY OF THE INVENTION

In the amplifier circuit for the MR head described so far, however, a resistance value of the first resistor in the first high pass filter and a resistance value of the second resistor in the second high pass filter would never be identical to each other. Furthermore, an emitter resistance in the first transistor of the third high pass filter and an emitter resistance in the second transistor of the fourth high pass filter would never be identical to each other. For these reasons, a voltage differential would be created in the voltage signals, when the first switch turns on the third high pass filter and the fourth high pass filter. There has always been a concern that the voltage signals, that include the voltage differential, would be amplified by the amplifier and be outputted.

It is possible to address this issue by delaying the second switch from starting the amplified signal output until the effect of the voltage differential in the voltage signals is eliminated. However, a dissipation of the voltage differential is dependent on a time constant in the first high pass filter, as well as a time constant in the second high pass filter. For example, when cutoff frequencies of the first high pass filter and the second high pass filter are 200 kHz, the time constant would be approximately 0.8 microsecond, which is an extremely long time period. As a result, there is a problem in that the start of the signal readout from the recording medium would be further delayed, making a rapid signal readout difficult.

To address the issue described above, the present invention provides an amplifier apparatus. The amplifier apparatus, which is switched from a non-readout state to a readout state based on a control signal; reads out a signal, which includes a servo signal, by signal readout means; amplifies the signal with an amplifier and outputs the amplified signal; wherein the amplifier apparatus includes filtering means for allowing high frequency part of a signal to pass through thereby filtering the signal with a first cutoff frequency during a first prescribed time period after the readout state has been initiated; a second cutoff frequency, which is at a lower frequency than the first cutoff frequency, during a second prescribed time period after the first prescribed time period has passed; and with a third cutoff frequency, which is at the lower frequency than the second cutoff frequency, after the second prescribed time period has passed.

Furthermore, in the present invention, the second prescribed time period is shorter than a readout time for the servo signal contained in the signal, and the filtering means for allowing high frequency part of signal to pass through is a high pass filter, which is placed between a first amplifier and a second amplifier for amplifying the signal.

Furthermore, the present invention provides a magnetic recording and reproducing apparatus having an amplified apparatus. The magnetic recording and reproducing apparatus having the amplified apparatus, which is switched from a recording operation state to a readout operation state based on a control signal; reads out a signal, which include a servo signal, by the signal readout means; and includes the amplifier apparatus for amplifying the signal with an amplifier and outputting the amplified signal; and filters the signal by the filtering means that allows high frequency part of signals to pass through with the first cutoff frequency during the first prescribed time period after the readout operation state has been initiated; the second cutoff frequency, which is at a lower frequency than the first cutoff frequency, during the second prescribed time period after the first prescribed time period has passed; and the third cutoff frequency, which is at a lower frequency than the second cutoff frequency, after the second prescribed time period has passed.

DESCRIPTION OF THE PREFERRED EMBODIMENT(S)

An amplifier apparatus of the present invention is switched from a non-readout state to a readout state based on a control signal; reads out a signal, which contains a servo signal, by signal readout means; amplifies the signal by an amplifier and outputs the amplified signal; includes filtering means for allowing high frequency part of a signal to pass through thereby filtering the signal with a first cutoff frequency during a first prescribed time period after the readout state has been initiated, with a second cutoff frequency being lower than the first cutoff frequency during a second prescribed time period after the first prescribed time period has passed; and with a third cutoff frequency being lower than the second cutoff frequency after the second prescribed time period has passed.

After the first prescribed time period has passed, the filtering means for allowing high frequency part of the signal to pass through is placed in a state with the second cutoff frequency, which is at a lower frequency than the first cutoff frequency but is at a higher frequency than the third cutoff frequency, in order to filter out the signal with the second cutoff frequency and to eliminate a voltage differential in the signal in a short period of time, and rapidly begin an output of the amplified signal, which would be free from the influence of voltage differential.

A magnetic recording and reproducing apparatus that includes such an amplifier apparatus would be able to begin outputting the amplified signal more rapidly, after the magnetic recording and reproducing apparatus is switched to the signal readout state; shorten a duration of time during which a recording medium rotates without the signal being read out; and enhance a recording density on the recording medium.

Figure 1:
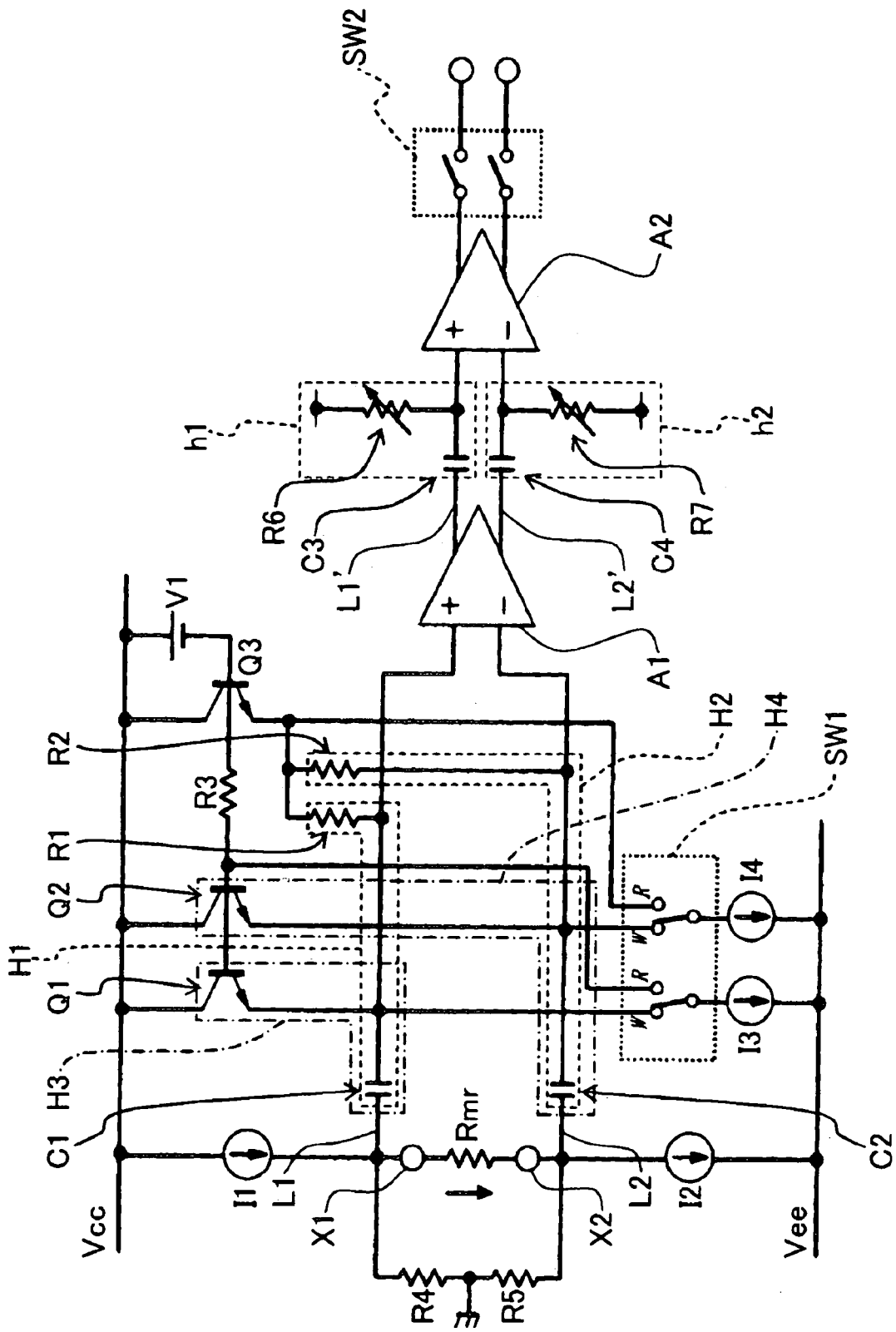
FIG. 1 is a circuit diagram showing an amplifier circuit of the present invention.
Figure 4:
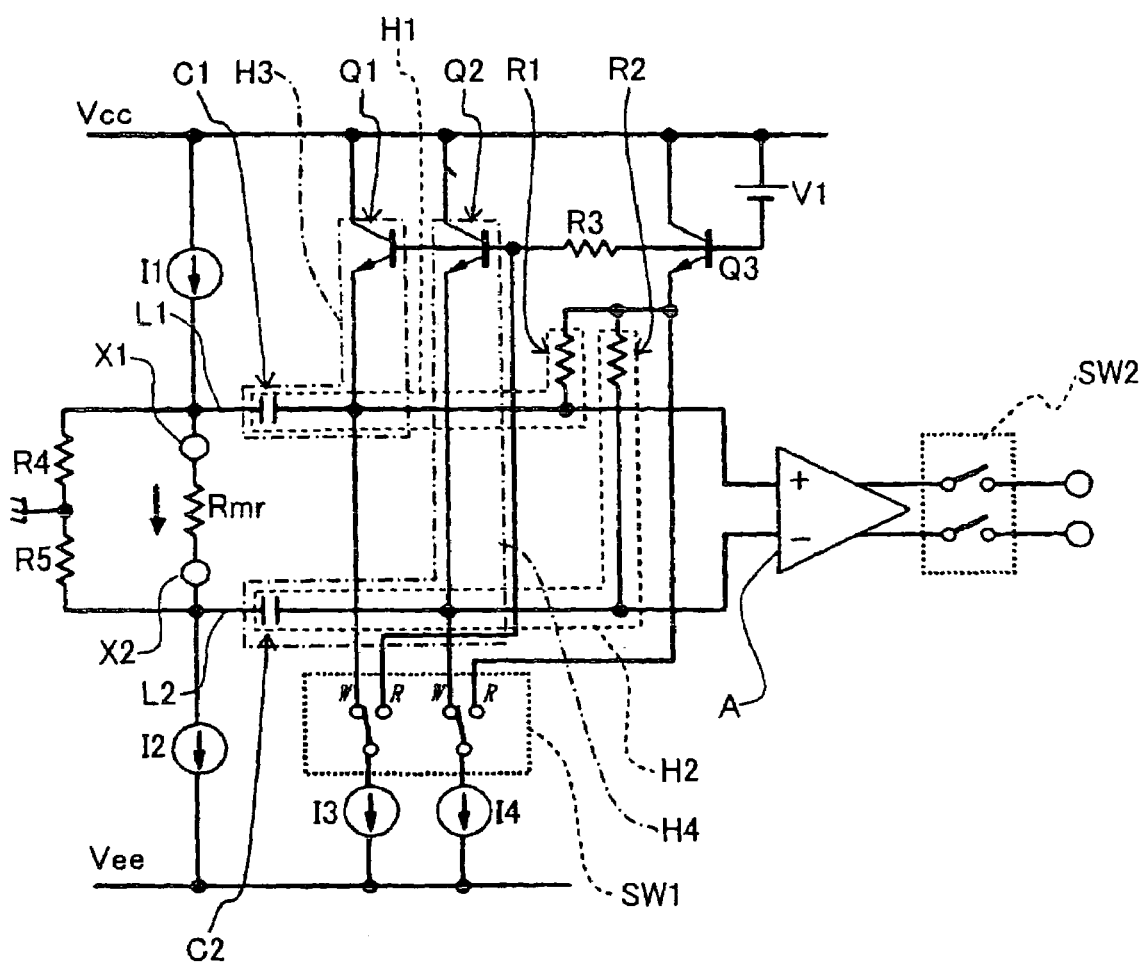
FIG. 4 is a circuit diagram showing an amplifier circuit of a prior art.

An embodiment of the present invention will be described below by referring to the drawings. FIG. 1 is a circuit diagram showing an amplifier circuit, which is an amplifier apparatus to which an MR head of a magnetic recording readout apparatus is connected. It is noted that, those members, that are identical to the amplifier circuit of the prior art in FIG. 4, will be described using the same reference numerals.

The amplifier circuit includes a first MR head connection terminal X1 and a second MR head connection terminal X2, to which an MR head Rmr is connected. The MR head Rmr is connected between the first MR head connection terminal X1 and the second MR head connection terminal X2. A first output line L1 is connected to the first MR head connection terminal X1, while a second output line L2 is connected to the second MR head connection terminal X2. Other ends of the first MR head connection terminals X1 and the second MR head connection terminal X2, respectively, are connected to a first amplifier Al.

Furthermore, a first current source I1 is connected to the first MR head connection terminal X1, while a second current source I2 is connected to the second MR head connection terminal X2, in order to apply a bias voltage on the MR head Rmr. In FIG. 1, R4 and R5 are reference numerals for resistors that are placed for stabilizing the MR head Rmr.

Changes in the bias voltage in the MR head Rmr, which correspond to signals that are read out from the recording medium, are outputted as voltage signals from the first output line L1 and the second output line L2 and inputted into the first amplifier A1. The first amplifier A1 generates first amplifier signals as an output based on the inputted voltage signals.

A first high pass filter H1 for DC cutoff, which includes a first capacitor C1 and a first resistor R1, is placed in the middle of the first output line L1, while a second high pass filter H2 for DC cutoff, which includes a second capacitor C2 and a second resistor R2, is placed in the middle of the second output line L2.

Furthermore, a third high pass filter H3, which includes a first transistor Q1 instead of the first resistor R1, is placed in the middle of the first output line L1, while a fourth high pass filter H4, which includes a second transistor Q2 instead of the second resistor R2, is placed in the middle of the second output line L2.

The first transistor Q1 and the second transistor Q2 perform an activation control under a first switch SW1, which performs a switching control, as the magnetic recording and reproducing apparatus switches between a read mode in which signals are read out from the recording medium, and a write mode in which signals are written to the recording medium. The first transistor Q1 and the second transistor Q2 are configured in such a way as to make the third high pass filter H3 and the fourth high pass filter H4 active in the write mode, and make the first high pass filter and the second high pass filter H2 active in the read mode.

In FIG. 1, V1 refers to a bias voltage supply, Q3 refers to a third transistor for controlling the operation of the first high pass filter H1 and the second high pass filter H2, R3 refers to a third resistor for voltage adjustment, I3 refers to a third current source, and I4 refers to a fourth current source.

Furthermore, capacitors that have identical characteristics are used for the first capacitor C1 and the second capacitor C2; resistors that have identical characteristics are used for the first resistor R1 and the second resistor R2; transistors that have identical characteristics are used for the first transistor Q1 and the second transistor Q2; and current sources that have identical characteristics are used for the third current source I3 and the fourth current source I4.

In the amplifier circuit described above, the main feature of the present invention is that filtering means, which allows high frequency part of signals to pass through with a variable cutoff frequency, on an output side of the first amplifier A1 is provided. More specifically, in the present embodiment, a variable high pass filter is used as the filtering means for allowing high frequency part of signals to pass through.

In other words, a first variable high pass filter h1, which includes the third capacitor C3 and a sixth resistor R6 whose resistance value is variable is placed on a first amplifier output line L1', which outputs the first amplified signals from the first amplifier A1. A second variable high pass filter h2, which includes a fourth capacitor C4 and a seventh resistor R7 whose resistance value is variable is placed on the second amplifier output line L2'.

Furthermore, the first amplifier output line L1' and the second amplifier output line L2' are connected to a second amplifier A2. The second amplifier A2 further amplifies the first amplified signals and generates and outputs amplified signals.

On an output side of the second amplifier A2, a second switch SW2 for controlling the amplified signal output is provided. When the second switch SW2 is turned on, the amplified signals are outputted.

Figure 2:
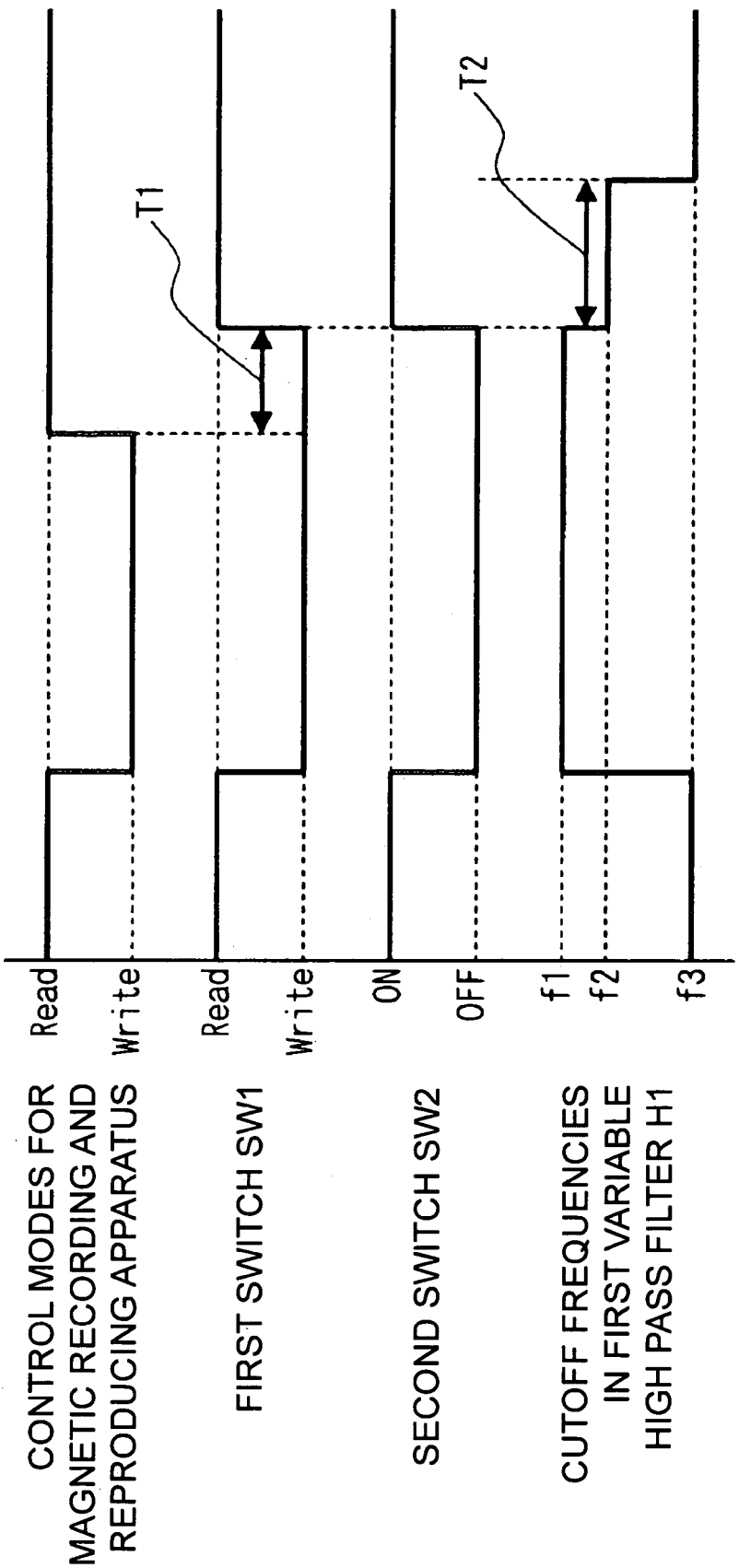
FIG. 2 is a timing chart that shows operating states of a variable high pass filter circuit.

As shown in FIG. 2, the cutoff frequencies of the first variable high pass filter h1 and the second variable high pass filter h2 are at a first cutoff frequency f1 during a delay time period T1, which is a first prescribed time period; are at a second cutoff frequency f2, which is at a lower frequency than the first cutoff frequency f1, during a second prescribed time period, as a result of the resistance values of the sixth transistor R6 and the seventh transistor R7 being adjusted after the second switch SW2 is turned on in order to begin outputting the amplified signals after the delay time period T1; and are at a third cutoff frequency f3, which is at a lower frequency than the second cutoff frequency f2, as a result of the resistance values of the sixth resistor R6 and the seventh resistor R7 being adjusted after the second prescribed time period has passed.

Here, the capacitors of identical characteristics are used for the third capacitor C3 and the fourth capacitor C4, while the variable resistors of identical characteristics are used for the sixth resistor R6 and the seventh resistor R7.

A switching control over the cutoff frequency in the first variable high pass filter h1 and the second variable high pass filter h2 will be described next by referring to FIG. 2. In the meantime, while FIG. 2 illustrates the switching control over the cutoff frequency in the first variable high pass filter h1, the switching control works identically in the second variable high pass filter h2.

When a control mode in the magnetic recording and reproducing apparatus is a write mode, or in other words when the magnetic recording and reproducing apparatus is in a recording state or in a non-readout state, the first switch SW1 is turned to the write side, while the second switch SW2 is turned off. At the same time, the first cutoff frequency f1 in the first variable high pass filter h1 and in the second variable high pass filter h2 is set at a relatively high value by selecting small resistance values for the sixth resistor R6 and the seventh resistor R7.

Furthermore, when the control mode in the magnetic recording and reproducing apparatus is switched from the write mode to a read mode, and the magnetic recording and reproducing apparatus goes into a reproducing state and readout state, a control apparatus, which is not shown in the figure, switches the first switch SW1 to a read side and turns on the second switch SW2, after the delay time period T1, which is the first prescribed time period that has been set in advance, passes, in order to begin outputting the amplified signals from the second amplifier A2.

Furthermore, larger resistance values are selected for the sixth resistor R6 in the first variable high pass filter h1 and the seventh resistor R7 in the second variable high pass filter h2, at the same time as the first switch SW1 and the second switch SW2 are switched by the control apparatus, in order to switch the first variable high pass filter h1 and the second variable high pass filter h2 to the second cutoff frequency f2, which is at a lower frequency than the first cutoff frequency f1.

The resistance values for the sixth resistor R6 and the seventh resistor R7 are selected in such a way as to make the second cutoff frequency f2 as low as possible, while minimizing the time constants in the first variable high pass filter h1 and the second variable high pass filter h2 as much as possible.

More particularly, effects of a voltage differential, which is included in the first amplified signals, which are an output from the first amplifier A1, can be eliminated in a short period of time by making the time constants as small as possible. However, because the amplified signals are being outputted at this time by turning on the second switch SW2, there is a concern that signals of a required frequency may not be obtained, if the second cutoff frequency f2 were set too high. Therefore, the second cutoff frequency f2 is determined by taking these issues into consideration.

Furthermore, the servo signals, which are included in the signals, can be accurately read out, even when the second cutoff frequency f2 is set at a relatively high frequency. By setting the second cutoff frequency f2 at a relatively high frequency in order to make the time period T2, over which the second cutoff frequency f2 is maintained, shorter than a readout time for the servo signals, which are always read out first from the recording medium, it would be possible to remove the effects of the differential voltage, which is included in the first amplified signals while the servo signals are read out, in a short period of time and to rapidly begin the readout of the signals that follow the servo signals.

After the second prescribed time period, which is the time period T2 over which the second cutoff frequency f2 is maintained, passes, the control apparatus increase the resistance values of the sixth resistor R6 of the first variable high pass filter h1 and the seventh resistor R7 of the second variable high pass filter h2, so that the first variable high pass filter h1 and the second variable high pass filter h2 would have the third cutoff frequency f3, which is at a lower frequency than the second cutoff frequency f2.

The third cutoff frequency f3 should be a frequency that would enable to take out signals of the required frequency level.

As thus described, by maintaining the second cutoff frequency f2, which is a higher frequency than the third cutoff frequency f3, over a predetermined time period T2 after the output of the amplified signals begins, it is possible to remove the effects of the voltage differential, which is included in the signals, over a short period of time by the process that take place with the second cutoff frequency f2 in order to read out the usable amplified signals more rapidly.

When the amplified signals can be read out more rapidly, an amount of time over which the recording medium rotates without the signals being read out by the magnetic recording and reproducing apparatus is shortened, and as a result, a recording density on the recording medium is enhanced.

Figure 3:
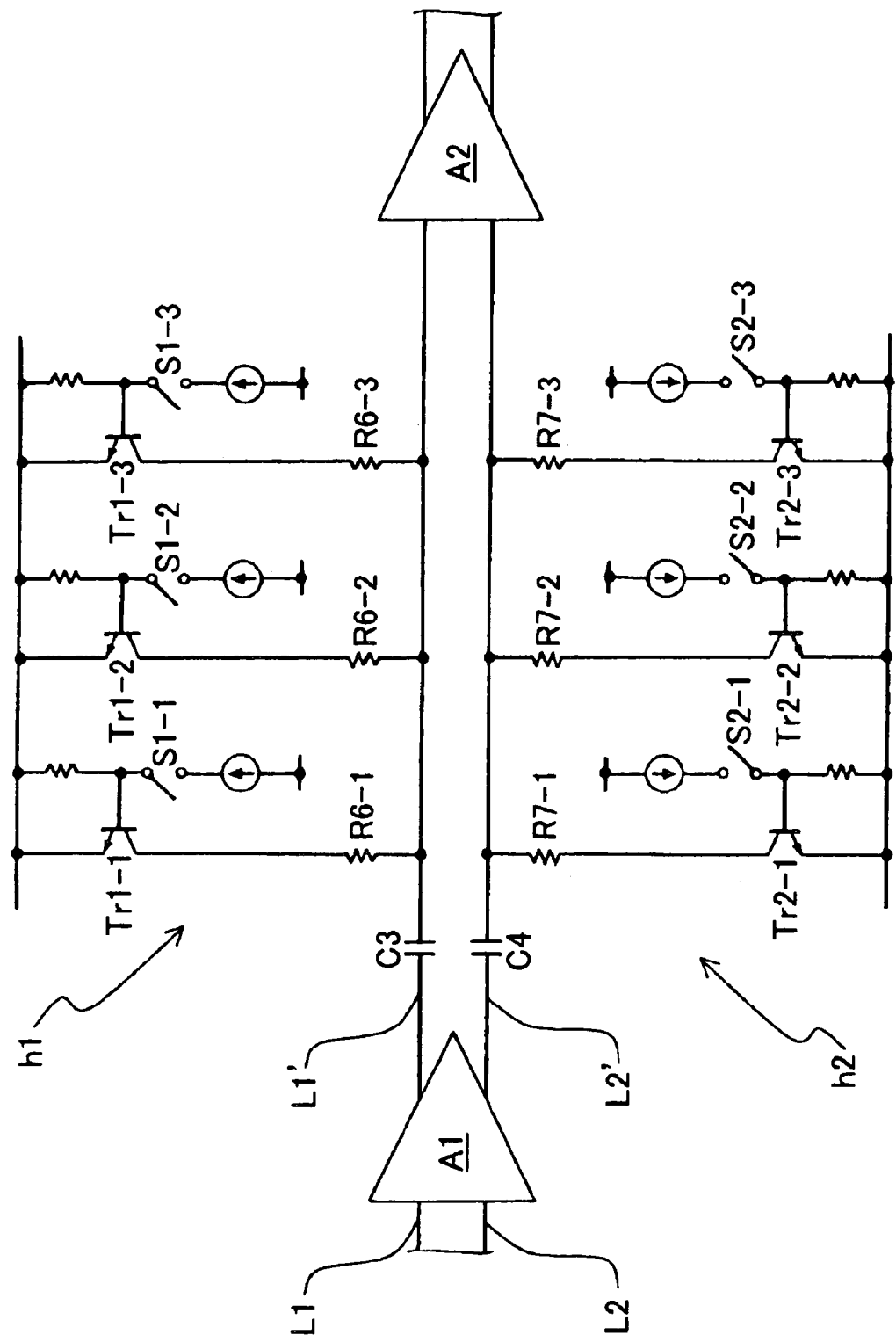
FIG. 3 is a circuit diagram showing the variable high pass filter.

In the present embodiment, the first variable high pass filter h1 and the second variable high pass filter h2 are specifically configured as shown in FIG. 3.

In other words, an area corresponding to the sixth resistor R6 of the first variable high pass filter h1 includes on one side connected to a first cutoff frequency resistor R6-1, a second cutoff frequency resistor R6-2, and a third cutoff frequency resistor R6-3, which are of different resistance values and to which controller transistors Tr1-1, Tr1-2, and Tr1-3, respectively, which are turned on and off by control switches S1-1, S1-2, and S1-3, respectively, are connected. The first cutoff frequency resistor R6-1, the second cutoff frequency resistor R6-2, and the third cutoff frequency resistor R6-3 are connected in parallel to a first amplifier output line L1'. One of the first cutoff frequency resistor R6-1, the second cutoff frequency resistor R6-2, or the third cutoff frequency resistor R6-3 is connected to the third capacitor C3, when one of the control switches S1-1, S1-2, or S1-3 is turned on.

Similarly, an area corresponding to the second resistor R7 of the second variable high pass filter h2 includes on one side connected to a first cutoff frequency resistor R7-1, a second cutoff frequency resistor R7-2, and a third cutoff frequency resistor R7-3, which are of different resistance values and to which controller transistors Tr2-1, Tr2-2, and Tr2-3, respectively, which are turned on and off by control switches S2-1, S2-2, and S2-3, respectively, are connected. The first cutoff frequency resistor R7-1, the second cutoff frequency resistor R7-2, and the third cutoff frequency resistor R7-3 are connected in parallel to a first amplifier output line L2'. One of the first cutoff frequency resistor R7-1, the second cutoff frequency resistor R7-2, or the third cutoff frequency resistor R7-3 is connected to the fourth capacitor C4, when one of the control switches S2-1, S2-2, or S2-3 is turned on.

In this configuration, the first cutoff frequency f1 may be selected to match the cutoff frequencies of the third high pass filter H3 and the fourth high pass filter H4. Furthermore, the third cutoff frequency f3 may be selected to match the cutoff frequencies for the first high pass filter H1 and the second high pass filter H2.

When the first variable high pass filter h1 and the second variable high pass filter h2 are placed between the first amplifier A1 and the second amplifier A2, a higher precision is achieved with the amplified signals, because the influence of errors, which are attributable to a processing precision in the first variable high pass filter h1 and the second variable high pass filter h2, is limited to the amount of the amplified by the second amplifier A2.

However, if the first variable high pass filter h1 and the second variable high pass filter h2 were placed on the input side of the first amplifier A1, the precision of the amplified signals would be lowered, because the influence of the errors, which are attributable to the processing precision in the first variable high pass filter h1 and the second variable high pass filter h2, would be amplified by both the first amplifier A1 and the second amplifier A2.

Furthermore, if the first variable high pass filter h1 and the second variable high pass filter h2 were placed on the output side of the second amplifier A2, then a buffer circuit would be required on the output side of the first variable high pass filter h1 and the second variable high pass filter h2, and, as a result, a size of the amplifier circuit would become larger.

Therefore, a smaller amplifier circuit can be configured, and a higher precision is achieved with the amplified signal output, when the first variable high pass filter h1 and the second variable high pass filter h2 are placed between the first amplifier A1 and the second amplifier A2, because the second amplifier A2 would also function as the buffer circuit.

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. An amplifier apparatus, which is switched from a non-readout state to a readout state based on a control signal, for reading out a signal containing a servo signal by signal readout means, amplifying the signal by an amplifier, and outputting said amplifying signal, wherein said amplifier apparatus comprises filtering means for allowing a high frequency part of a signal to pass through, thereby filtering said signal, said filtering means having a first cutoff frequency during a first prescribed time period after said readout state is initiated, a second cutoff frequency that is lower than said first cutoff frequency during a second prescribed time period after said first prescribed time period has passed, and a third cutoff frequency that is lower than said second cutoff frequency after said second prescribed time period has passed, wherein said second prescribed time period is shorter than a readout time for said servo signal contained in said signal.

2. The amplifier apparatus of claim 1, wherein said filtering means for allowing said high frequency part of said signal to pass through is a high pass filter, and said high pass filter is placed between a first amplifier and a second amplifier, which are for amplifying said signal.

3. An amplifier apparatus, which is switched from a non-readout state to a readout state based on a control signal, for reading out a signal containing a servo signal by signal readout means, amplifying said signal by an amplifier, and outputting said amplified signal, wherein said an amplifier apparatus comprises:

variable filtering means with a plurality of cutoff frequencies, a first amplifier, a second amplifier; and switching means for controlling said amplified signal output, and said switching means being placed on an output side of said second amplifier, wherein said output signal from said first amplifier passes through said variable filtering means and is amplified by said second amplifier, wherein said variable filtering means has a first cutoff frequency, a second cutoff frequency, and a third cutoff frequency, wherein after said non-readout state is switched to said readout state, said variable filtering means has said first cutoff frequency during a first prescribed time period, wherein said switching means is turned on, and said variable filtering means has said second cutoff frequency during a second prescribed time period after said first prescribed time period has passed, wherein said variable filtering means has a third cutoff frequency after said second prescribed time period has passed, and wherein said first cutoff frequency is higher than said second cutoff frequency and said second cutoff frequency is higher than said third cutoff frequency, wherein said second prescribed time period is shorter than a readout time for said servo signal contained in said signal.

4. A magnetic recording and reproducing apparatus comprising an amplifying apparatus, which is switched from a recording state to a readout state based on a control signal, for reading out a signal containing a servo signal by signal readout means, amplifying said signal by an amplifier, and outputting said amplified signal, wherein:

said amplifier apparatus comprises filtering means for allowing a high frequency part of a signal to pass through, thereby filtering said signal, said filtering means having a first cutoff frequency during a prescribed time period after said readout state is initiated, a second cutoff frequency that is lower than said first cutoff frequency during a second prescribed time period after said first prescribed time has passed, and a third cutoff frequency that is lower than said second cutoff frequency after said second prescribed time period has passed, wherein said second prescribed time period is shorter than a readout time for said servo signal, which is contained in said signal.

5. The magnetic recording and reproducing apparatus comprising the amplifier apparatus of claim 4, wherein said filtering means for allowing a high frequency part of a signal to pass through is a high pass filter, and said high pass filter is placed between a first amplifier and a second amplifier, which amplify said signal.

6. A magnetic recording and reproducing apparatus comprising an amplifier apparatus, which is switched from a non-readout state to a readout state based on a control signal, for reading out a signal containing a servo signal by signal readout means, amplifying said signal by an amplifier, and outputting said amplified signal, wherein said magnetic recording and reproducing apparatus comprising an amplifier apparatus comprises variable filtering means with a plurality of cutoff frequencies, a first amplifier, and a second amplifier; wherein an output signal from said first amplifier passes through said variable filtering means and is amplified by said second amplifier, wherein switching means for controlling an amplified signal output is placed on an output side of said second amplifier, wherein said variable filtering means has a first cutoff frequency, a second cutoff frequency, and a third cutoff frequency, wherein after said non-readout state is switched to said readout state, said variable filtering means has said first cutoff frequency during a first prescribed time period, wherein after said first prescribed time period has passed, said switching means is turned on, and said variable filtering means has said second cutoff frequency during a second prescribed time period, wherein said variable filtering means has a third cutoff frequency after said second prescribed time period; and wherein said first cutoff frequency is higher than said second cutoff frequency, and said second cutoff frequency is higher than said third cutoff frequency, wherein said second prescribed time period is shorter than a readout time for said servo signal, which is contained in said signal.

* * * * *